(12) United States Patent
Brennan et al.

(10) Patent No.: US 7,928,005 B2
(45) Date of Patent: Apr. 19, 2011

(54) METHOD FOR FORMING NARROW STRUCTURES IN A SEMICONDUCTOR DEVICE

(75) Inventors: Michael Brennan, Campbell, CA (US); Scott Bell, San Jose, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/235,214

(22) Filed: Sep. 27, 2005

(65) Prior Publication Data

US 2007/0072437 A1    Mar. 29, 2007

(51) Int. Cl.
*H01L 21/44* (2006.01)

(52) U.S. Cl. ........ 438/642; 438/424; 438/629; 438/706; 257/347; 257/507; 257/E21.038; 257/E21.235

(58) Field of Classification Search .......... 438/642, 438/424, 427, 430, 595, 689, 629, 637, 638, 438/706, 709, 942, 950; 257/507, E21.038, 257/E21.039, E21.235, 347
See application file for complete search history.

(56) References Cited

U.S. PATENT DOCUMENTS

| | | | |
|---|---|---|---|
| 6,242,788 B1 | 6/2001 | Mizuo | |
| 6,475,916 B1 * | 11/2002 | Lee et al. | 438/706 |
| 6,624,016 B2 * | 9/2003 | Wu | 438/221 |
| 6,955,961 B1 * | 10/2005 | Chung | 438/241 |
| 7,018,551 B2 * | 3/2006 | Beintner et al. | 216/11 |
| 2003/0109093 A1 * | 6/2003 | Harari et al. | 438/200 |
| 2004/0029372 A1 * | 2/2004 | Jang et al. | 438/586 |
| 2004/0082177 A1 * | 4/2004 | Lee | 438/690 |
| 2004/0110358 A1 * | 6/2004 | Lee | 438/437 |
| 2005/0179030 A1 * | 8/2005 | Seo et al. | 257/20 |
| 2005/0272259 A1 * | 12/2005 | Hong | 438/669 |
| 2006/0115978 A1 * | 6/2006 | Specht et al. | 438/637 |
| 2006/0157773 A1 * | 7/2006 | Yu et al. | 257/314 |
| 2006/0186509 A1 | 8/2006 | Larsen | |

FOREIGN PATENT DOCUMENTS

WO    2005/038930    4/2005

OTHER PUBLICATIONS

PCT Search Report and Written Opinion, Jan. 23, 2007, 10 pages.

* cited by examiner

*Primary Examiner* — Matthew S Smith
*Assistant Examiner* — Su C Kim
(74) *Attorney, Agent, or Firm* — Harrity & Harrity, LLP

(57) ABSTRACT

A method of forming multiple conductive structures in a semiconductor device includes forming spacers adjacent side surfaces of a mask, where the mask and the spacers are formed on a conductive layer. The method also includes etching at least one trench in a portion of the conductive layer not covered by the spacers or the mask. The method may further include depositing a material over the semiconductor device, removing the mask and etching the conductive layer to remove portions of the conductive layer not covered by the spacers or the material, where remaining portions of the conductive layer form the conductive structures.

16 Claims, 17 Drawing Sheets

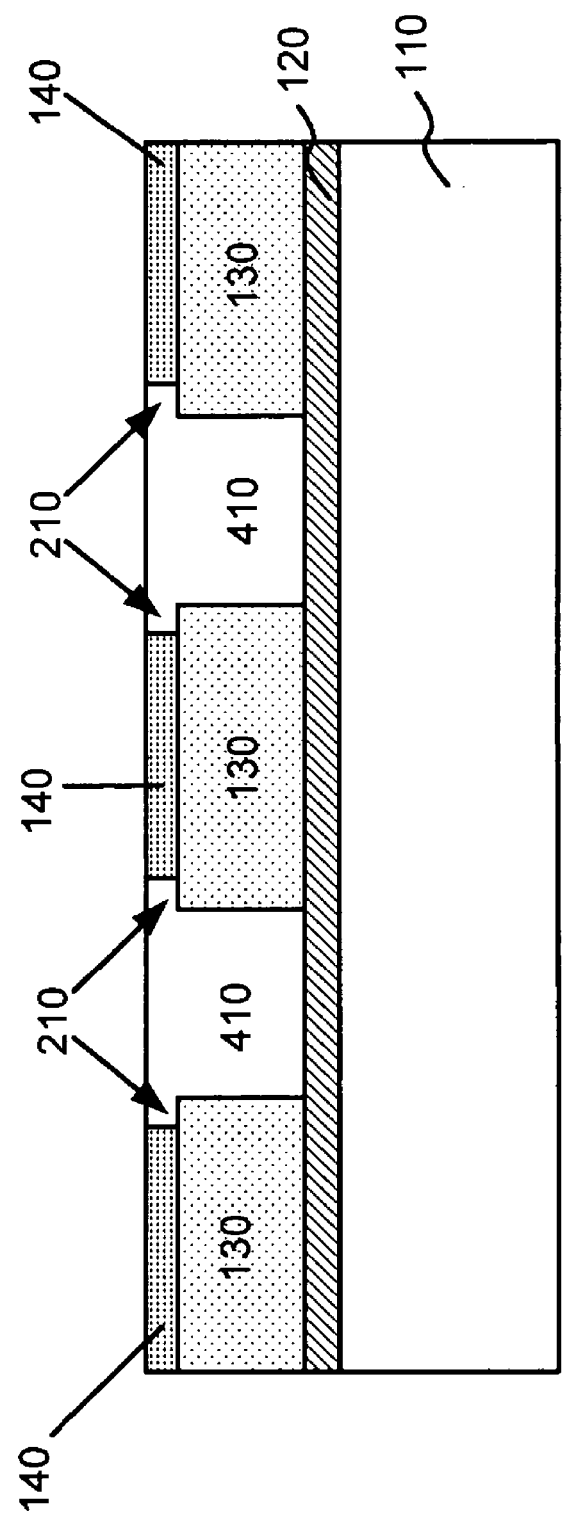

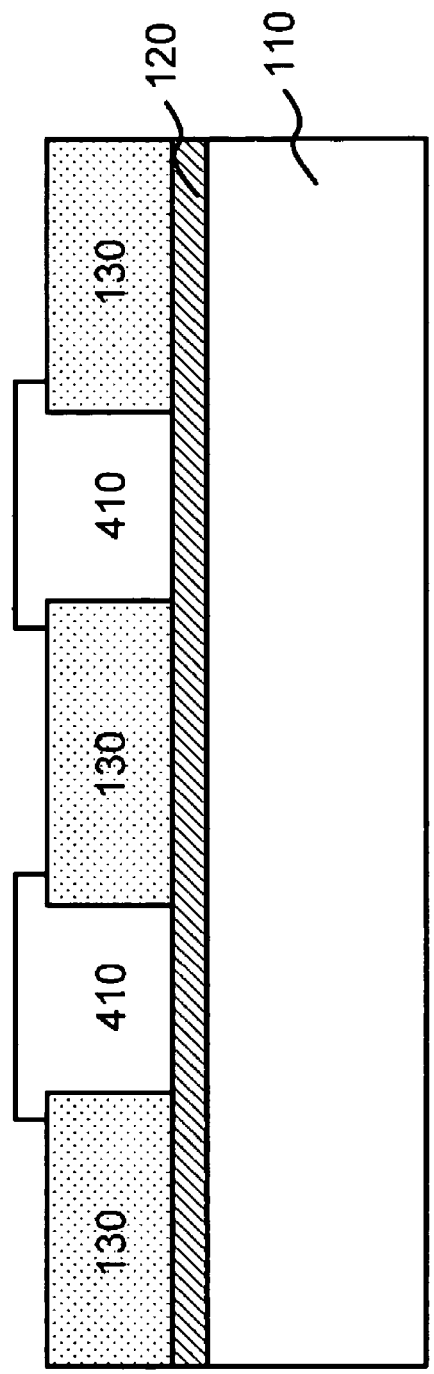

METHOD FOR FORMING NARROW STRUCTURES IN A SEMICONDUCTOR DEVICE

TECHNICAL FIELD

The invention relates to semiconductor devices and methods of manufacturing semiconductor devices. The invention has particular applicability to semiconductor devices having narrow features.

BACKGROUND ART

The escalating demands for high density and performance associated with ultra large scale integration semiconductor devices require very small design features, high reliability and increased manufacturing throughput. The reduction of design features challenges the limitations of conventional methodology.

For example, there are a number of problems associated with attempting to form narrow device features in a conductive material, such as silicon or polycrystalline silicon. More particularly, the desired width of the device features are often much smaller than that which can be directly formed using lithography.

Spacers are often used as etch masks to attempt to form the desired device features. Spacers, however, are inherently asymmetrical and present problems during etching. For example, hard mask erosion associated with spacers adversely affects the final feature profile. Such problems often result in an undesirable feature profile that may lead to device performance problems and/or reliability problems.

DISCLOSURE OF THE INVENTION

Advantages and features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect, a method of forming a plurality of structures in a semiconductor device is provided. The method includes forming a mask over a first layer, forming spacers adjacent side surfaces of the mask and etching at least one trench in a portion of the first layer not covered by the mask. The method also includes depositing a second material over the semiconductor device, where the second material fills the trench. The method further includes planarizing the second material, removing the mask and etching the first layer to remove portions of the first layer not covered by the spacers or the second material. A remaining portion of the first layer comprises the plurality of structures.

According to another aspect, a method of manufacturing a semiconductor device, includes forming a plurality of masks over a conductive layer, forming spacers adjacent sidewalls of the plurality of masks and forming a plurality of trenches in the conductive layer. The method also includes depositing a first material to fill at least a portion of each of the plurality of trenches and removing the plurality of masks. The method further includes etching the conductive layer to remove portions of the conductive layer not protected by the spacers or the first material, where a remaining portion of the conductive layer forms a plurality of conductive structures.

According to a further aspect, a method of forming a semiconductor device includes forming spacers adjacent sidewalls of a plurality of masks, wherein the spacers and the plurality of masks are formed on a conductive layer and a width of each of the spacers is equal to a first width. The method also includes forming a plurality of trenches in the conductive layer, depositing a first material to fill at least a portion of the trenches and removing the masks. The method further includes etching the conductive layer to remove portions of the conductive layer not protected by the spacers or the first material, where a remaining portion of the conductive layer forms a plurality of conductive structures and each of the conductive structures has a width approximately equal to the first width.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 4A and 4B are cross-sections illustrating the deposition and planarization of a material over the device of FIG. 3.

FIG. 5 is a cross-section illustrating the removal of the masks of FIG. 4B.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
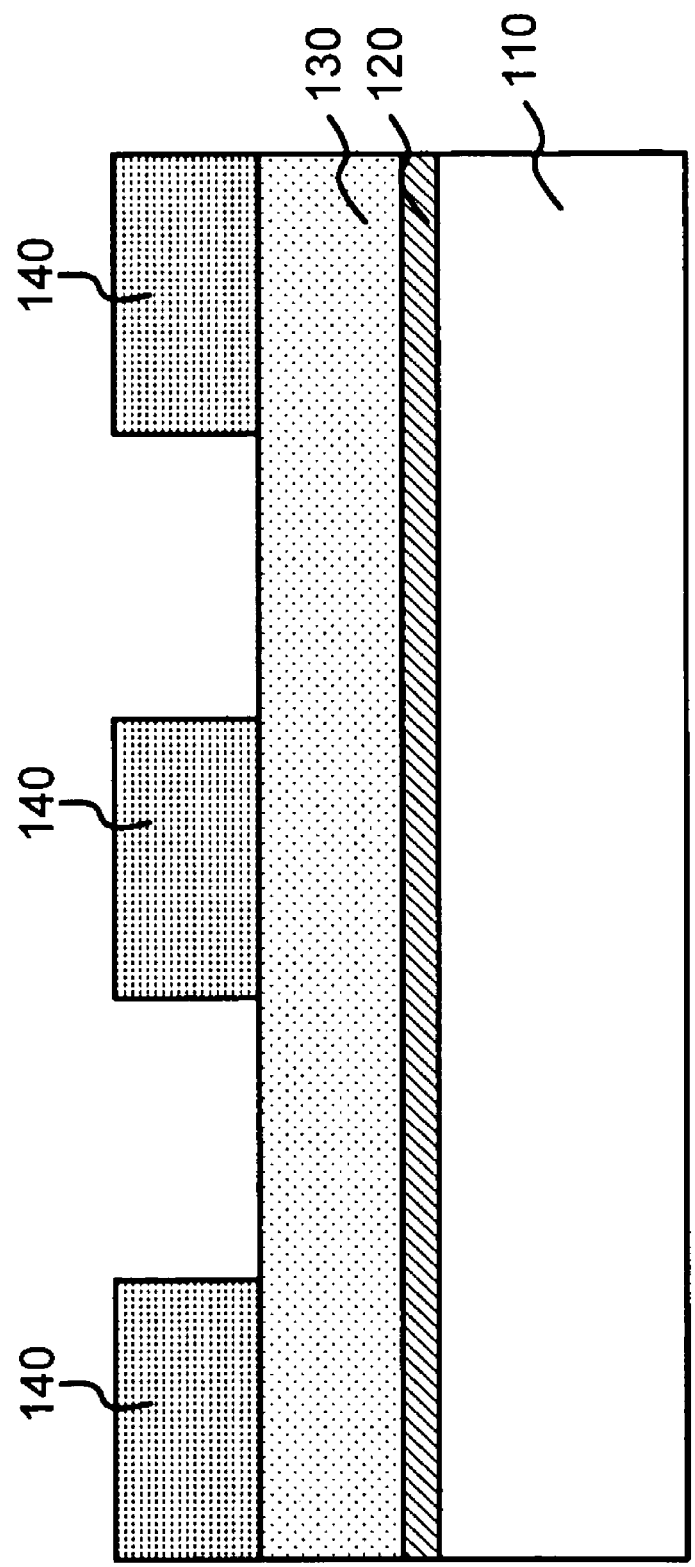
FIG. 1 is a cross-section illustrating exemplary layers used for forming device structures in accordance with an embodiment of the invention.

FIG. 1 illustrates the cross-section of a semiconductor device 100 formed in accordance with an embodiment of the invention. Referring to FIG. 1, semiconductor device 100 may include layers 110, 120 and 130. Layer 110 may be a substrate layer of semiconductor device 100 and may comprise, for example, silicon, germanium, silicon-germanium or some other semiconducting material. Alternatively, layer 110 may be located a number of layers above the substrate of semiconductor device 100.

In an exemplary implementation, layer 120 may include a dielectric layer, such as a silicon oxide layer (e.g., $SiO_2$), formed on layer 110. Alternatively, layer 120 may include a nitride material (e.g., $Si_3N_4$) or another dielectric material. Layer 120 may have a thickness ranging from about 10 angstroms (Å) to about 100 Å.

Layer 130 may include a conductive layer, such as monocrystalline or polycrystalline silicon, having a thickness ranging from about 700 Å to about 2,000 Å. Alternatively, layer 130 may include other conductive materials, such as germanium or silicon-germanium, or may include various metals (e.g., aluminum, copper, titanium, etc.). Layer 130 may be used to form multiple devices features (e.g., active lines) for semiconductor device 100, as described in more detail below.

A mask material may be deposited and patterned using lithography to form masks 140, as illustrated in FIG. 1. In an exemplary implementation, the mask material may be a dielectric material, such as a silicon nitride (e.g., $Si_3N_4$) a silicon oxynitride (e.g., SiON) or some other dielectric material. The mask material may be deposited and patterned in any conventional manner. Masks 140, as described in more detail below, may be used to facilitate the formation of a number of device features in semiconductor device 100.

Figure 2:
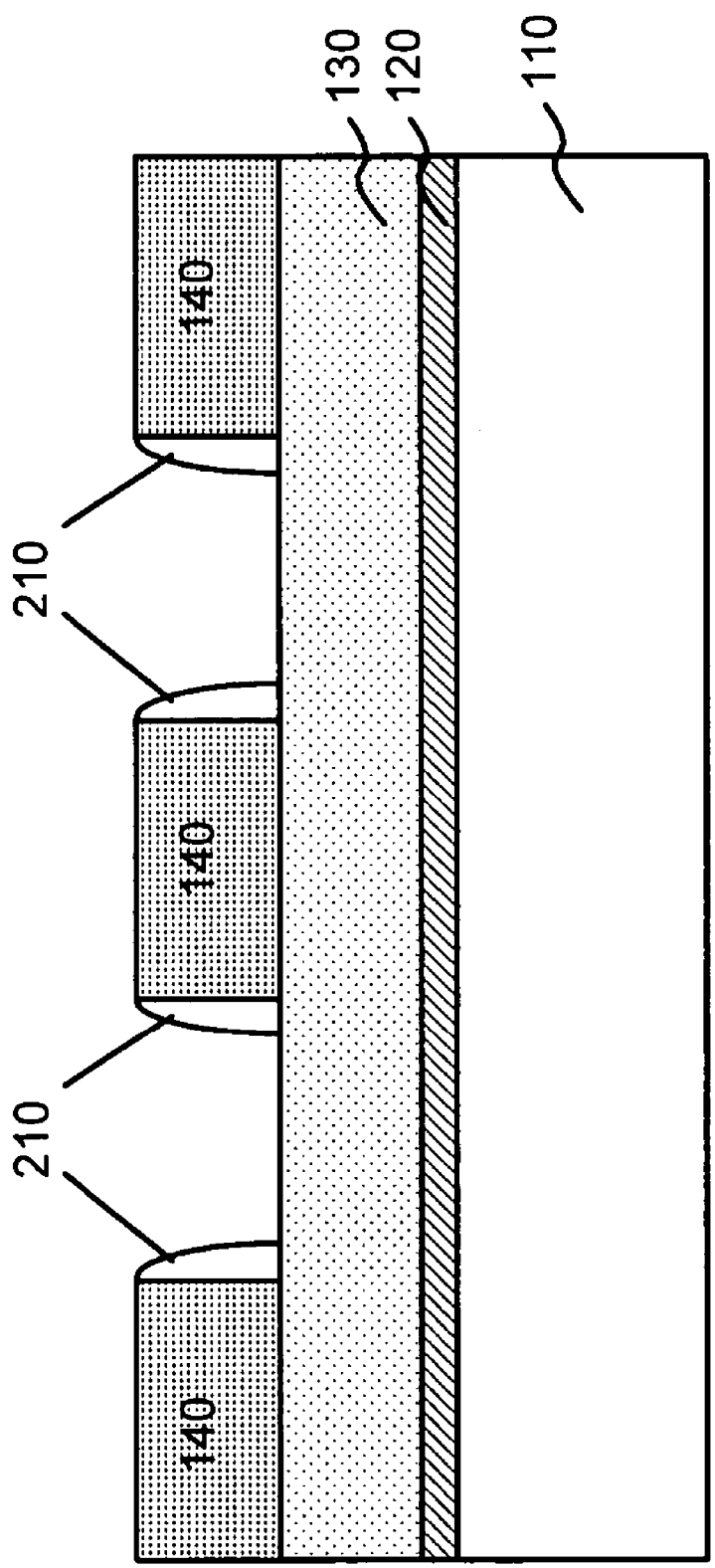
FIG. 2 is a cross-section illustrating the formation of spacers on the side surfaces of the masks of FIG. 1.

A dielectric material may then be deposited and etched to form spacers 210 on the sidewalls of masks 140, as illustrated in FIG. 2. In an exemplary implementation, spacers 210 may include an oxide, a nitride or another dielectric material. Spacers 210 may be formed to a predetermined width based on the desired width of the subsequently formed conductive structures. That is, the width of spacers 210 may be defined based on the particular device/circuit requirements associated with the subsequently formed conductive structures. In an exemplary implementations, spacers 210 may be formed to a width ranging from about 75 Å to about 400 Å.

Figure 3:
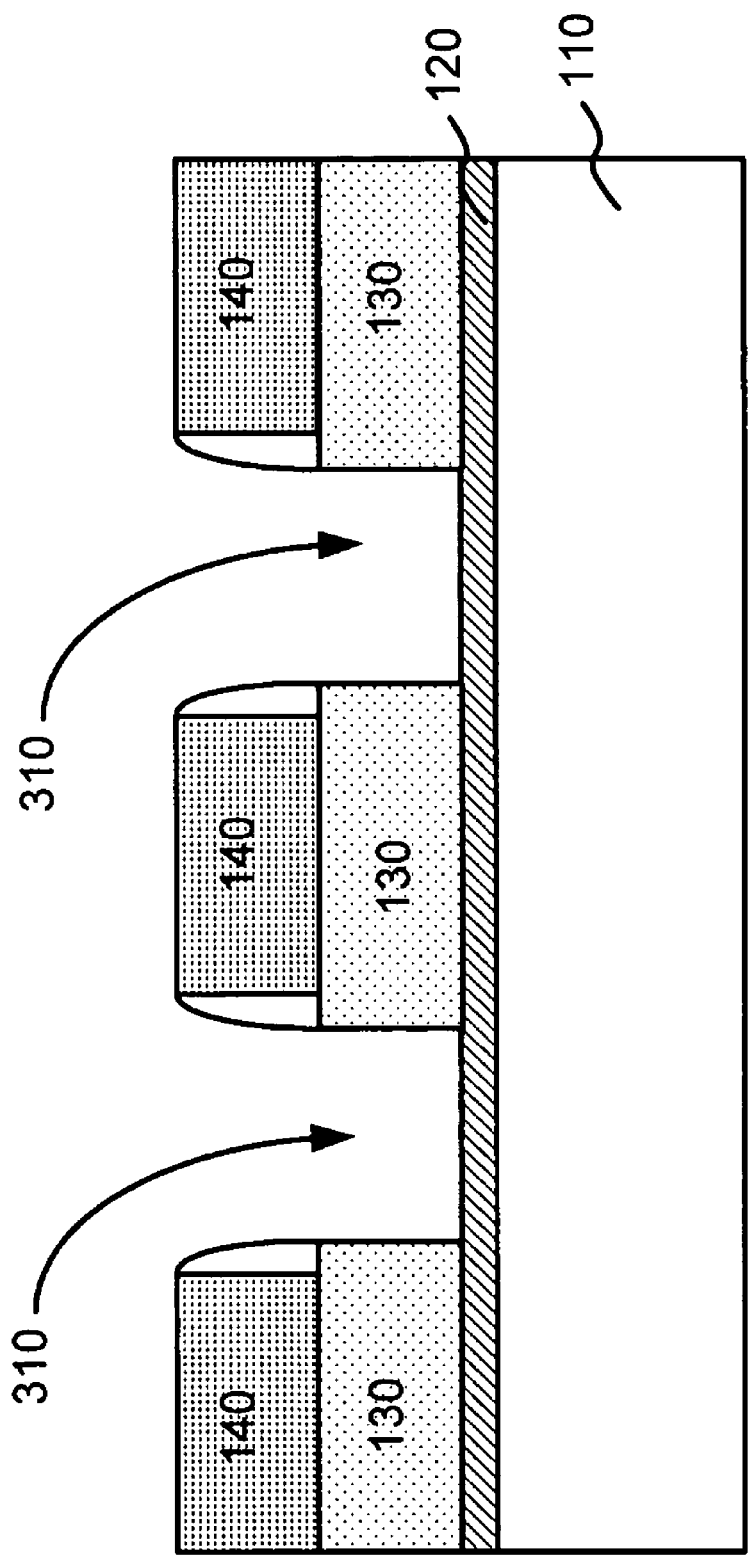
FIG. 3 is a cross-section illustrating the etching of the device of FIG. 2.

Layer 130 may then be etched. For example, the portion of layer 130 not protected by masks 140 and spacers 210 may be etched, with the etching terminating at layer 120, as illustrated in FIG. 3. As a result of the etching, trenches 310 are formed in layer 130. In some implementations, the etching of layer 130 may terminate prior to layer 120 based on the desired thickness (i.e., height) of the subsequently formed structures.

Figure 4A:
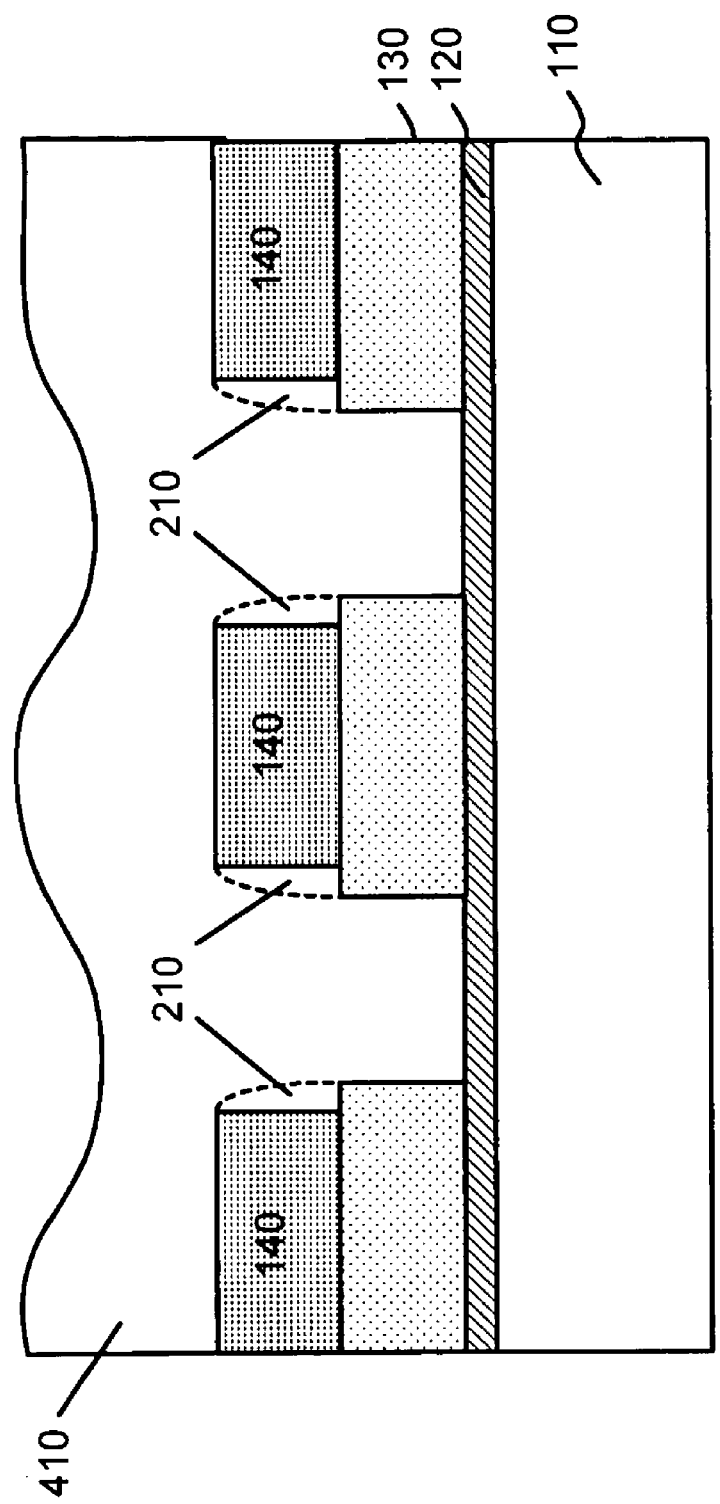

A layer 410 may then be deposited over semiconductor device 100, as illustrated in FIG. 4A. In an exemplary implementation, layer 410 may include the same material as spacers 210, such as a silicon oxide. In this case, layers 410 and spacers 210 may form a continuous layer in trenches 310 and over masks 140, as indicated by the dashed lines associated with spacers 210 in FIG. 4A. In alternative implementations, layer 410 may fill only a portion of trenches 310.

Layer 410 may then be planarized using, for example, a chemical-mechanical polishing (CMP), as illustrated in FIG. 4B, with masks 140 being used as a polish stopping layer. In an exemplary implementation, during the CMP, a portion of masks 140 may also be removed. For example, after the CMP, masks 140 may have a thickness ranging from about 200 Å to about 500 Å. After the CMP, the upper surface of layer 410 is substantially planar with the upper surface of masks 140, as illustrated in FIG. 4B. In addition, a small, controllable amount of material overhangs the remaining portions of layer 130, as indicated by the arrows in FIG. 4B. This overhanging portion may correspond to a portion of spacers 210 formed on the sidewalls of masks 140 and the width of this overhanging portion may correspond to the width of spacers 210. Spacers 210, however, are not separately illustrated within layer 410 in FIG. 4B, since in the implementation illustrated in FIG. 4B, the material used to form spacers 210 is the same material as that in layer 410. In addition, the portion of spacers 210 remaining after the CMP and layer 410 will be collectively referred to hereafter as layer 410 since in this exemplary implementation, spacers 210 and layer 410 include the same material (e.g., silicon oxide). It should be understood, however, that in some implementations, spacers 210 may not include the same material as that in layer 410. As illustrated in FIG. 4B, the remaining portion of spacers 210 and the material deposited to fill trenches 310 may form T-shaped structures that facilitate the formation of conductive structures in semiconductor device 100.

Masks 140 may then be removed, as illustrated in FIG. 5. For example, masks 140 may be etched using a selective etching process, such as a wet etching or dry etching process, which strips away masks 140, but does not affect layer 410.

Figure 6:
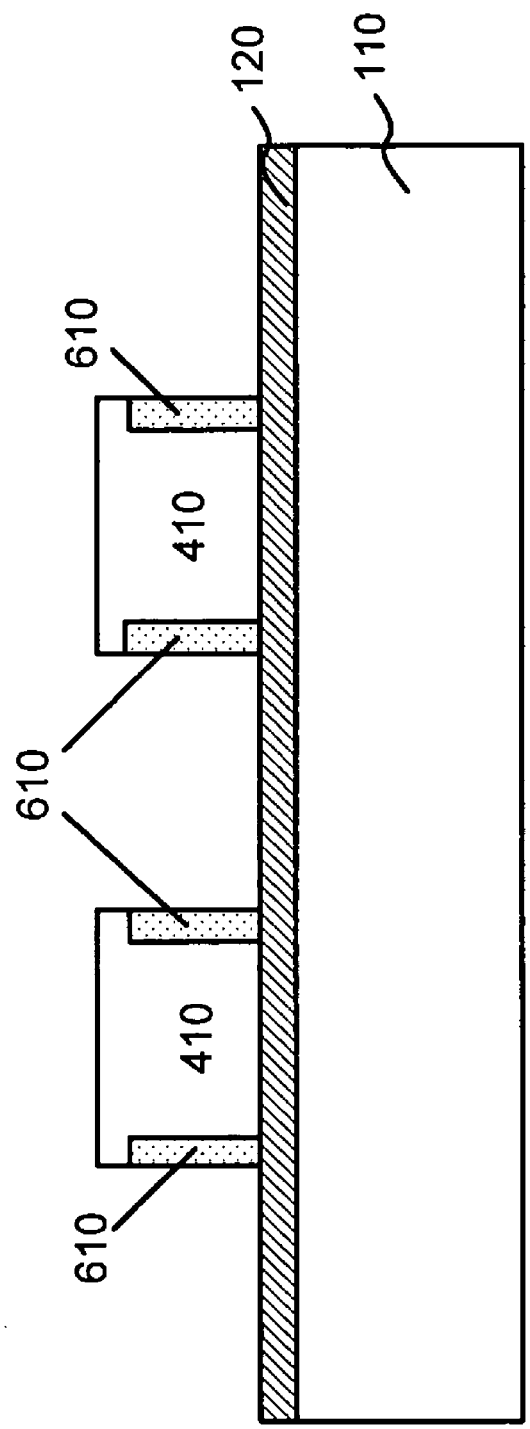
FIG. 6 is a cross-section illustrating the etching of the device of FIG. 5 to form device structures.

After masks 140 have been removed, layer 130 may be etched. During the etching, the portions of layer 410 that overhang layer 130 prevent the underlying portions of layer 130 from being etched, resulting in structures 610 illustrated in FIG. 6. That is, the portions of layer 130 that are located below the overhanging portions of layer 410 (i.e., the remaining portions of spacers 210) are not etched, thereby forming structures 610.

In an exemplary implementation, the width of structures 610 may range from about 75 Å to about 400 Å. It should be understood, however, that the particular width of structures 610 may vary based on the particular device/circuit requirements. In each case, the width of structures 610 may be approximately equal to the width of spacers 210. As discussed above, the process for forming spacers 210 may be controlled to form spacers having the desired width. This controllable process used to form spacers 210 may therefore be used with the subsequent processing described above to form structures 610 having the desired width.

Conductive structures 610 may be used in a number of semiconductor devices. For example, structures 610 may form active lines (i.e., bit lines or word lines) in a memory device, such as an electrically erasable read only memory (EEPROM) device. Alternatively, structures 610 may form active lines, such as gate structures in a metal oxide semiconductor field effect transistor (MOSFET) device or may form fins in a FinFET device in which the fins act as channel regions for the transistor device. Conductive structures 610 may also be used to form narrow dummy gate structures. Conductive structures 610 may further be used to form narrow hard masks that are symmetrical in shape, as opposed to hard masks formed by spacers, which may be used to etch narrow gates, fins or other structures.

Figure 7:
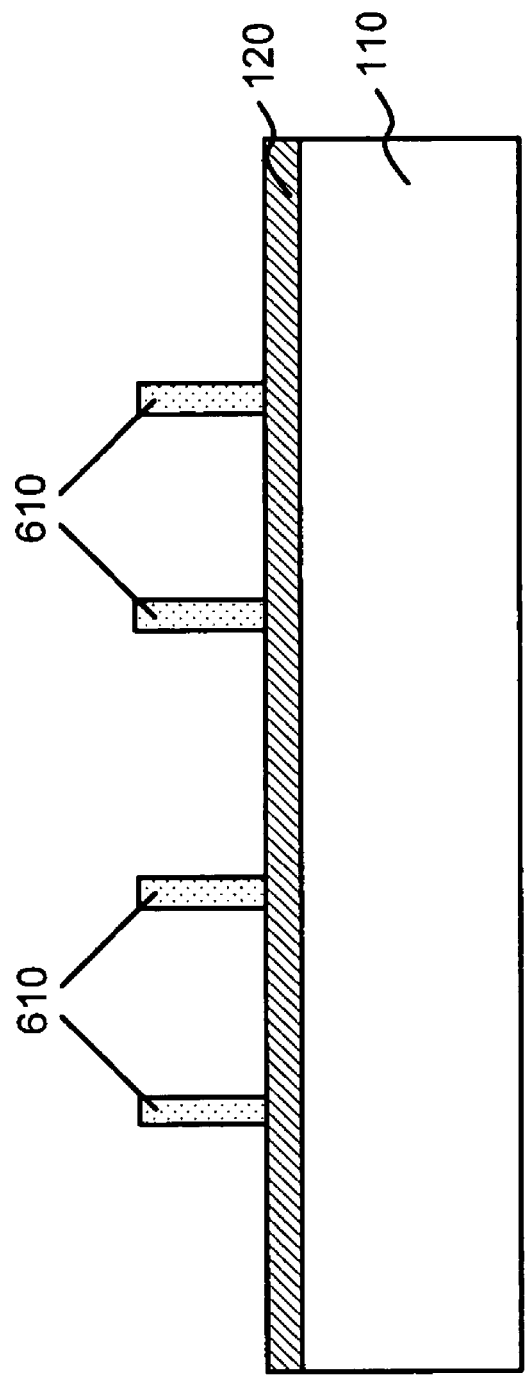
FIG. 7 is a cross-section illustrating the selective removal of material from the device of FIG. 6.

In some implementations, layer 410 may then be removed, as illustrated in FIG. 7. After the removal of layers 140, structures 610 may remain. In other implementations, dielectric layer 410 may not be removed. For example, dielectric layer 410 may form part of a dielectric layer that is used in semiconductor device 100, such as part of an inter-layer dielectric used to separate conductive structures 610 from other conductive features. In each case, structures 610 may be formed to the desired width and height based on the particular circuit requirements.

In addition, the pitch (i.e., the center-to-center distance) between structures 610 may be controlled based on the distance between adjacent masks 140. The particular pitch associated with structures 610 may also be controlled based on the particular circuit requirements.

The exemplary processing described above to form structures 610 uses two non-critical etch processes (i.e., the etches illustrated in FIGS. 3 and 6) to form narrow conductive structures 610. This is in contrast to attempting to form narrow conductive structures using a single critical etch process, which often results in a poor profile associated with the conductive structures.

Figure 8:
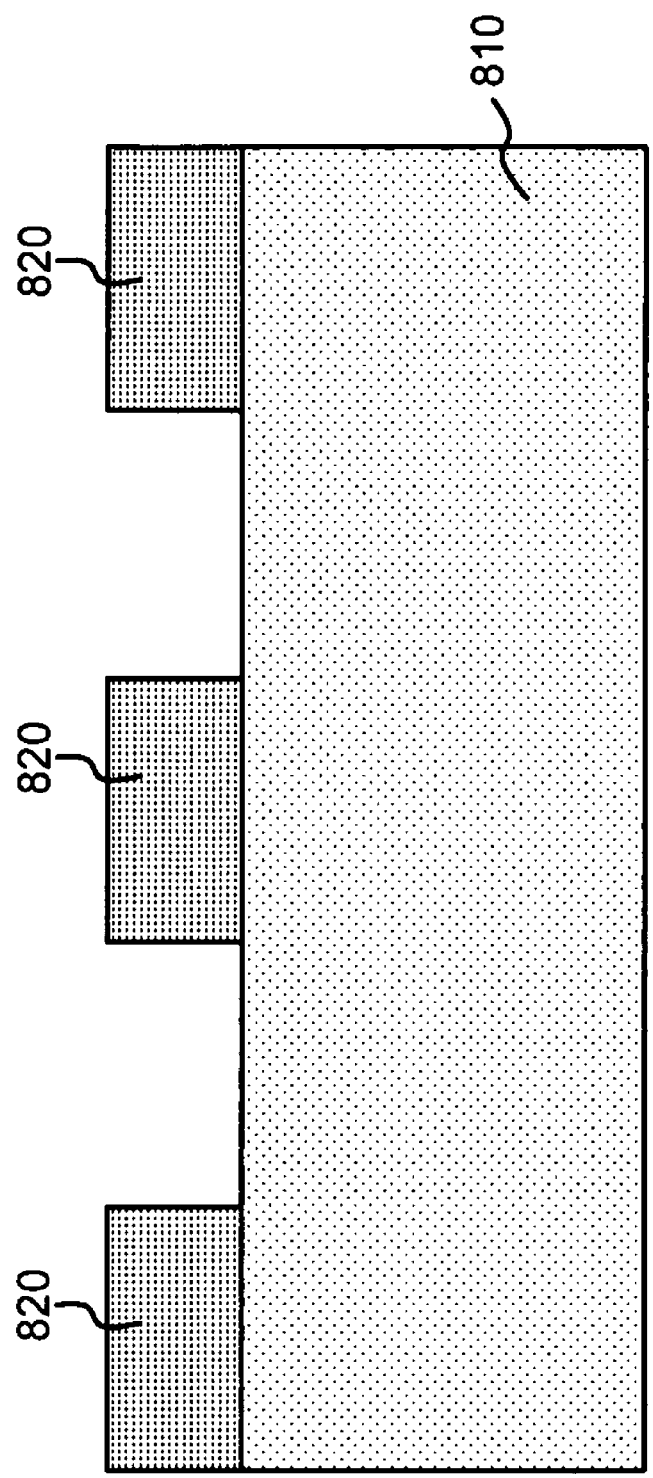
FIG. 8 is a cross-section illustrating exemplary layers used for forming device structures in accordance with another embodiment of the invention.

In another exemplary embodiment, processing similar to that described above with respect to FIGS. 1-6 may be used to form narrow device features in a semiconductor device. For example, FIG. 8 illustrates the cross-section of a semiconductor device 800 formed in accordance with another exemplary embodiment of the invention. Referring to FIG. 8, semiconductor device 800 may include layer 810. Layer 810 may be a conductive layer that includes silicon, such as monocrystalline or polycrystalline silicon, germanium, silicon-germanium or some other semiconducting material. In some implementations, layer 810 may be a substrate layer of semiconductor device 800. Alternatively, layer 810 may be located a number of layers above the substrate of semiconductor device 800. Layer 810 may also include other conductive materials, such as various metals (e.g., aluminum, copper, titanium, etc.). Layer 810 may be used to form multiple devices features (e.g., active lines, fins, etc.) for semiconductor device 800, as described in more detail below.

A mask layer may be deposited, patterned using lithography and etched to form masks 820, as illustrated in FIG. 8. In an exemplary implementation, masks 820 may include a dielectric material, such as a nitride (e.g., $Si_3N_4$). Alternatively, other materials may be used to form masks 820. In each case, masks 820 may be used to facilitate the formation of a number of device features in semiconductor device 800, as described in more detail below.

Figure 9:
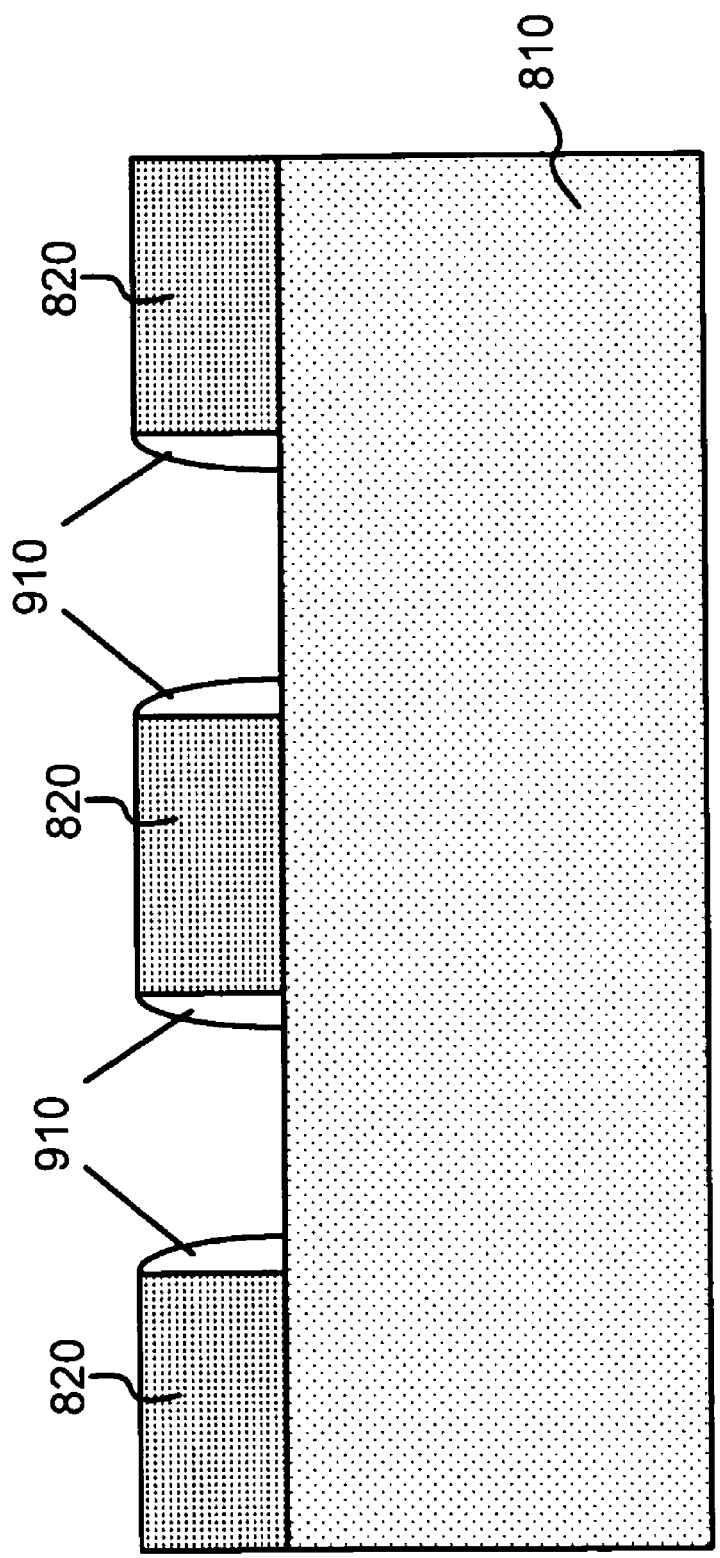
FIG. 9 is a cross-section illustrating the formation of spacers on the side surfaces of the masks of FIG. 8.

A dielectric material may then be deposited and etched to form spacers 910 on the sidewalls of masks 820, as illustrated in FIG. 9. In an exemplary implementation, spacers 910 may include an oxide, such as a silicon oxide. Alternatively, other dielectric materials may be used to form spacers 910. In each case, spacers 910 may be formed to a predetermined width based on the desired width of the subsequently formed conductive structures. That is, similar to the discussion above with respect to spacers 210, the width of spacers 910 may be defined based on the particular device/circuit requirements associated with the subsequently formed conductive structures. In an exemplary implementations, spacers 910 may be formed to a width ranging from about 75 Å to about 400 Å.

Figure 10:
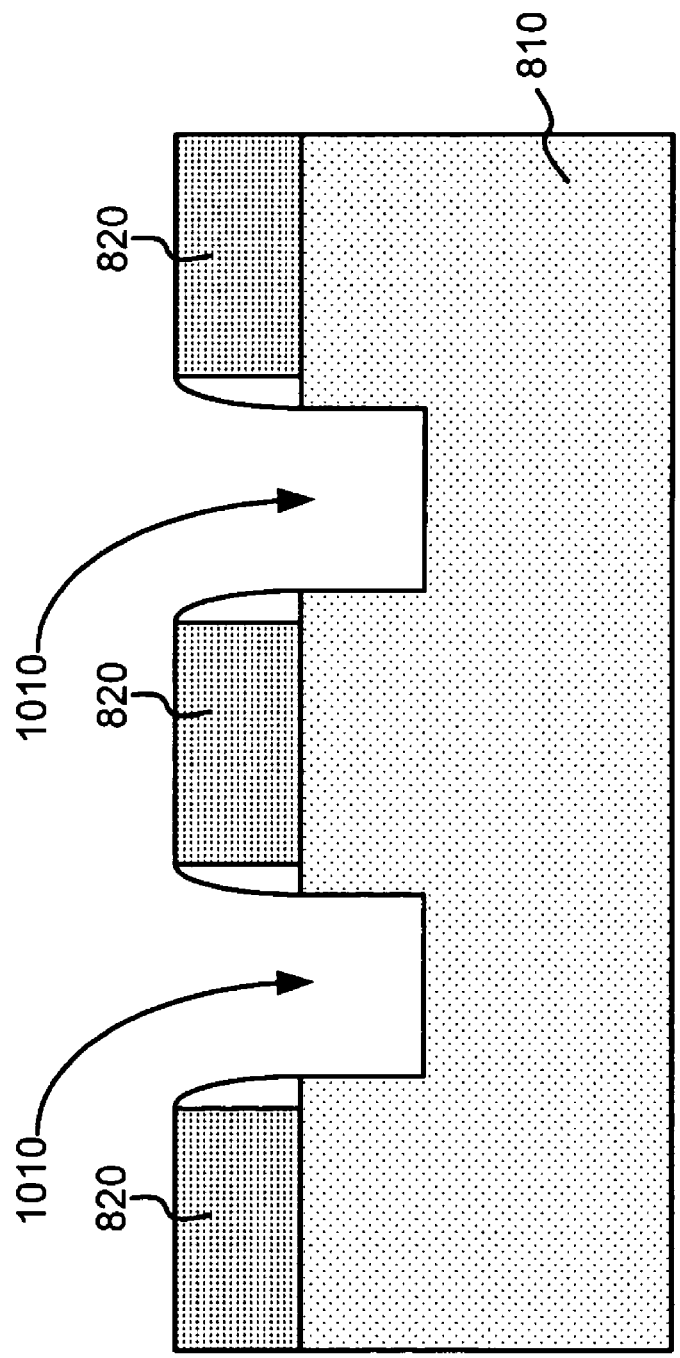
FIG. 10 is a cross-section illustrating the etching of the device of FIG. 9.

Layer 810 may then be etched. For example, the portion of layer 810 not protected by masks 820 and spacers 910 may be etched to form trenches 1010, as illustrated in FIG. 10. The etching of layer 810 may be a timed etch such that the depth of trenches 1010 after the etching ranges from about 500 Å to about 2,000 Å below the upper surface of layer 810. The particular depth of trenches 1010 may be based on the desired thickness (i.e., height) associated with the subsequently formed structures.

Figure 11A:
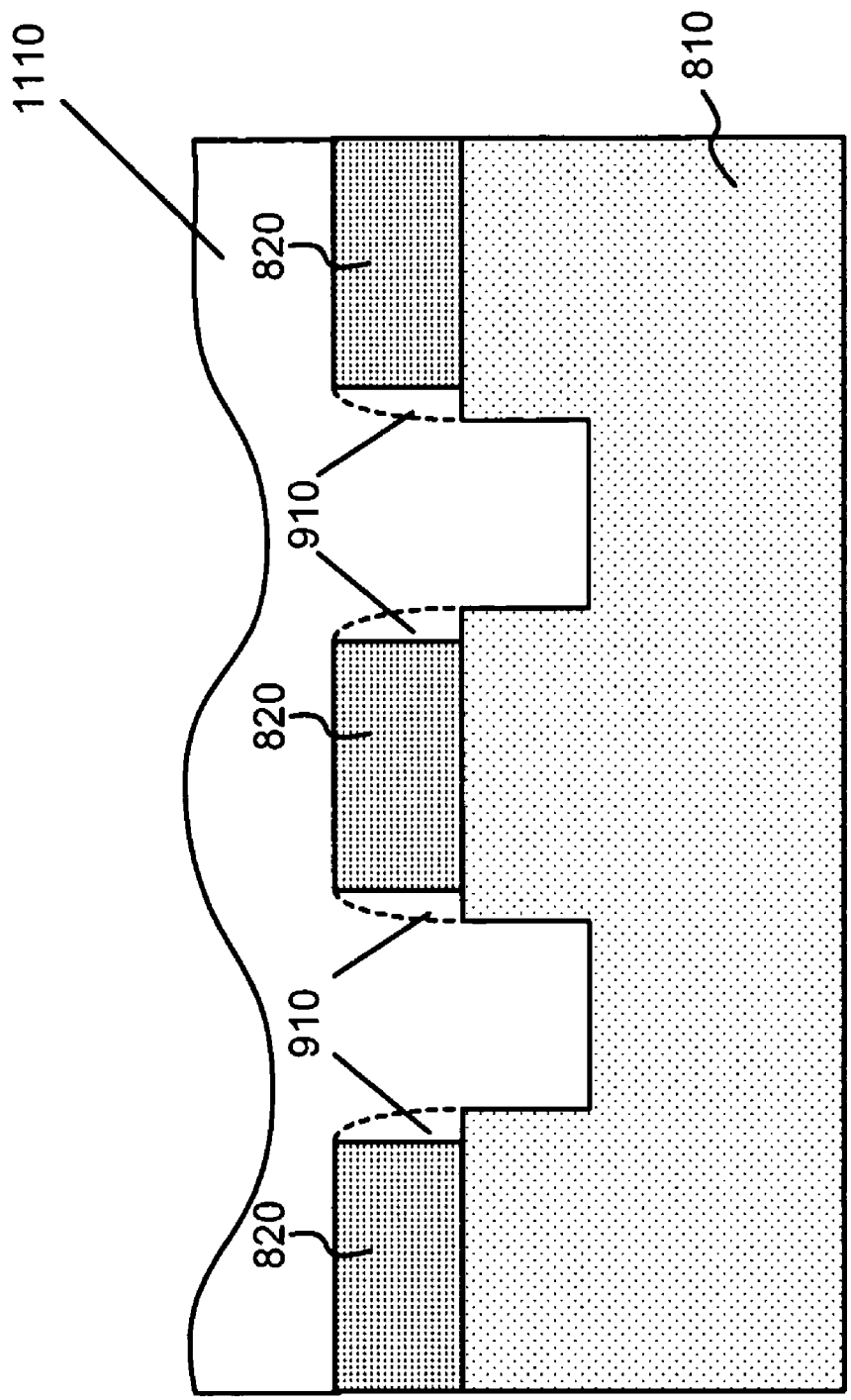
FIGS. 11A and 11B are cross-sections illustrating the deposition and planarization of a material over the device of FIG. 10.

A layer 1110 may then be deposited over semiconductor device 800, as illustrated in FIG. 11A. In an exemplary implementation, layer 1110 may include the same material as spacers 910. In this case, layers 1110 and spacers 910 may form a continuous layer in trenches 1010 and over masks 820, as indicated by the dashed lines associated with spacers 910 in FIG. 11A. In alternative implementations, layer 1110 may fill only a portion of trenches 1010.

Figure 11B:
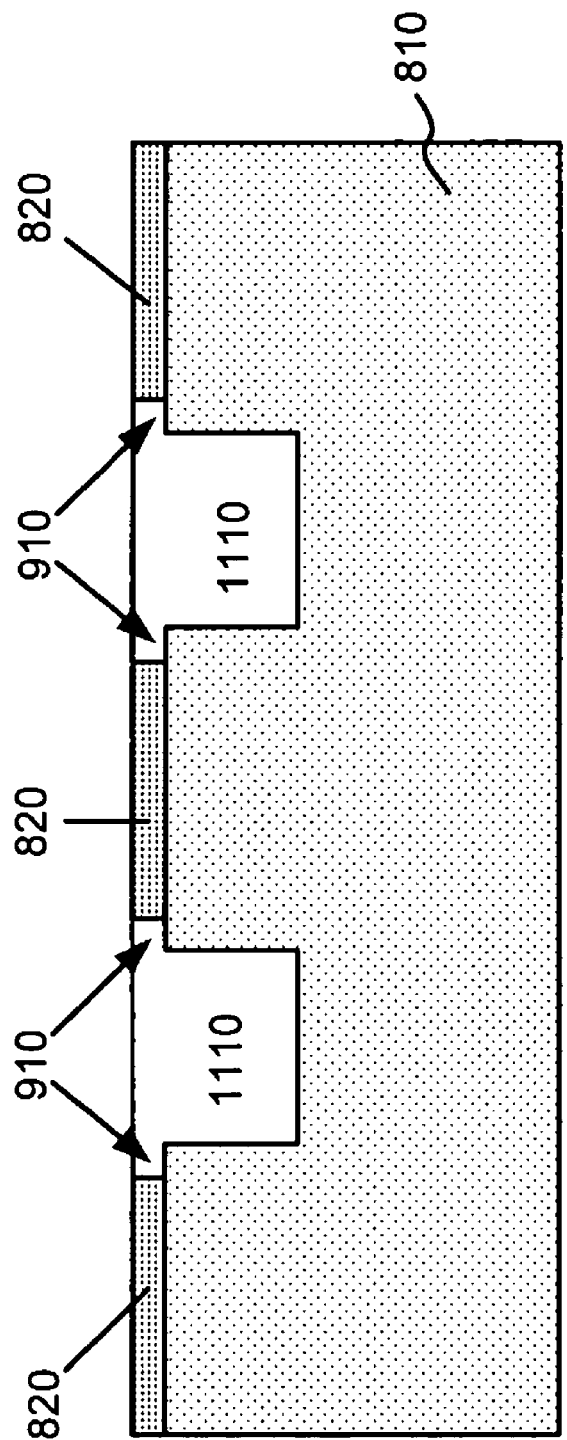

Layer 1110 may then be planarized using, for example, a CMP, as illustrated in FIG. 11B. Masks 820 may be used as a polish stopping layer. In an exemplary implementation, during the CMP, a portion of masks 820 may also be removed. For example, after the CMP, masks 820 may have a thickness ranging from about 200 Å to about 500 Å. After the CMP, the upper surface of layer 1110 is substantially planar with the upper surface of masks 820, as illustrated in FIG. 11B. In addition, a small, controllable amount of material overhangs portions of layer 810, as indicated by the arrows in FIG. 11B. This overhanging portion may correspond to a portion of spacers 910 formed on the sidewalls of masks 820 and the width of this overhanging portion may correspond to the width of spacers 910. This overhanging portion may be used to define the feature size of subsequently formed structures in semiconductor device 800. Spacers 910, however, are not separately illustrated within layer 1110 in FIG. 11B, since in the implementation illustrated in FIG. 11B, the material used to form spacers 910 is the same material as that in layer 1110. In addition, the portion of spacers 910 remaining after the CMP and layer 1110 will be collectively referred to hereafter as layer 1110 since in this exemplary implementation, spacers 910 and layer 1110 include the same material (e.g., silicon oxide). It should be understood, however, that in some implementations, spacers 910 may not include the same material as that in layer 1110. As illustrated in FIG. 11B, in an exemplary implementation, the remaining portion of spacers 910 and material 1110 deposited to fill trenches 1010 may form T-shaped structures that facilitate the formation of conductive structures in semiconductor device 800.

Figure 12:
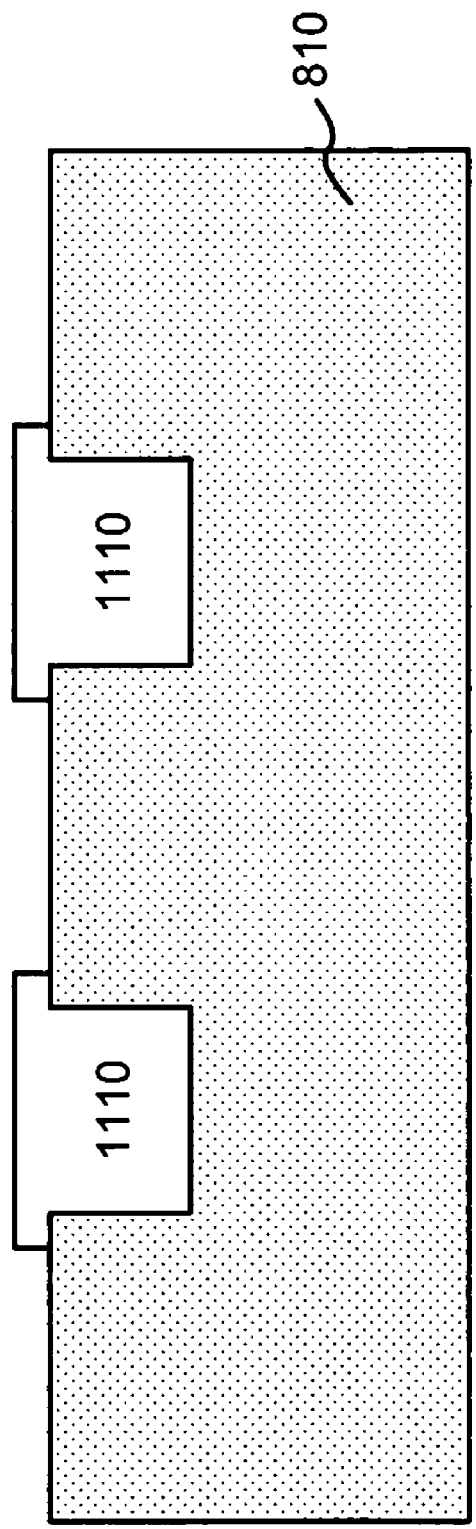
FIG. 12 is a cross-section illustrating the removal of the masks of FIG. 11B.

Masks 820 may then be removed, as illustrated in FIG. 12. For example, masks 820 may be etched using a selective etching process, such as a wet etching or dry etching process, which strips away masks 820, but does not affect layer 1110.

Figure 13:
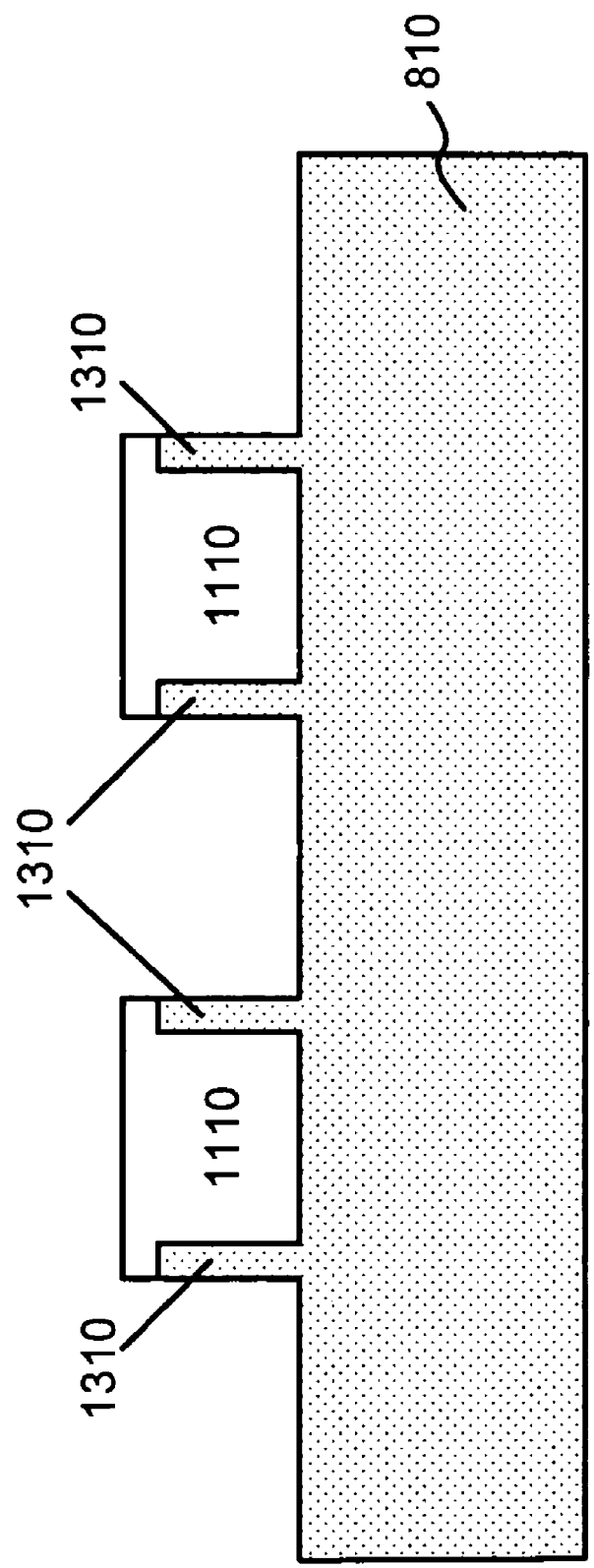
FIG. 13 is a cross-section illustrating the etching of the device of FIG. 12 to form device structures.

After masks 820 have been removed, layer 810 may be etched, as illustrated in FIG. 13. During the etching, the portions of layer 1110 that overhang portions of layer 810 prevent the underlying portions of layer 810 from being etched. That is, the portions of layer 810 that are located below layer 1110 are not etched, thereby forming structures 1310, as illustrated in FIG. 13.

In an exemplary implementation, the width of structures 1310 may range from about 75 Å to about 400 Å. It should be understood, however, that the particular width of structures 1310 may vary based on the particular device/circuit requirements. In each case, the width of structures 1310 may be approximately equal to the width of spacers 910. As discussed above, the process for forming spacers 910 may be controlled to form spacers having the desired width. This controllable process used to form spacers 910 may therefore be used with the subsequent processing described above to form structures 1310 having the desired width.

Conductive structures 1310 may be used in a number of semiconductor devices. For example, structures 1310 may form active lines (i.e., bit lines or word lines) in a memory device, such as an EEPROM device. Alternatively, structures 1310 may form active lines, such as gate structures in a MOSFET device or may form fins in a FinFET device in which the fins acts as channel regions for the transistor device. Conductive structures 1310 may also be used to form narrow dummy gate structures or narrow hard masks that are symmetrical in shape and which may be used to etch narrow gates, fins or other structures.

Figure 14:
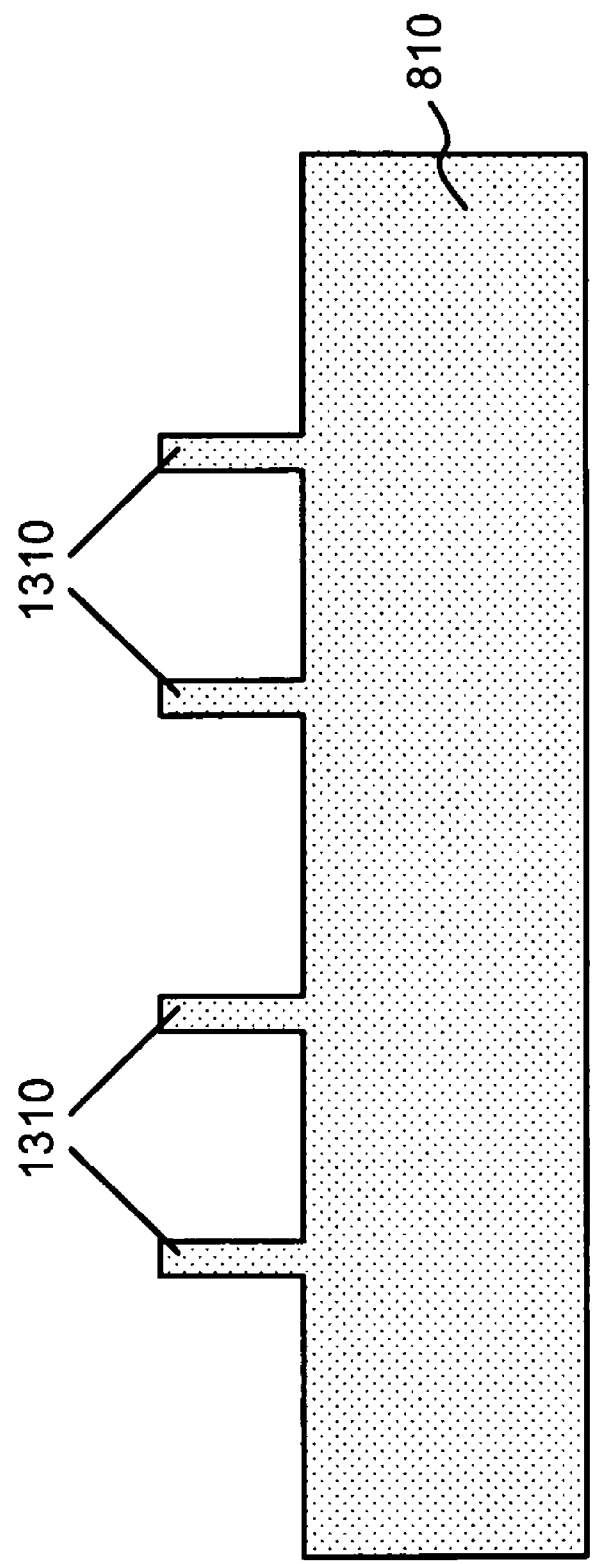
FIG. 14 is a cross-section illustrating the selective removal of material from the device of FIG. 13.

In some implementations, layer 1110 may then be removed, as illustrated in FIG. 14. After the removal of layer 1110, structures 1310 may remain. In other implementations, dielectric layer 1110 may not be removed. For example, dielectric layer 1110 may form part of a dielectric layer that is used in semiconductor device 800, such as part of an inter-layer dielectric used to separate conductive structures 1310 from other conductive features. In each case, structures 1310 may be formed to the desired width and height based on the particular circuit requirements.

In addition, the pitch (i.e., the center-to-center distance) between structures 1310 may be controlled based on the distance between adjacent masks 820. The particular pitch associated with structures 1310 may also be controlled based on the particular circuit/device requirements.

The exemplary processing described above to form structures 1310 uses two non-critical etch processes (i.e., the etches illustrated in FIGS. 10 and 13) to form narrow conductive structures 1310. This is in contrast to attempting to form narrow conductive structures using a single critical etch process, which often results in a poor profile associated with the conductive structures.

Figure 15A:
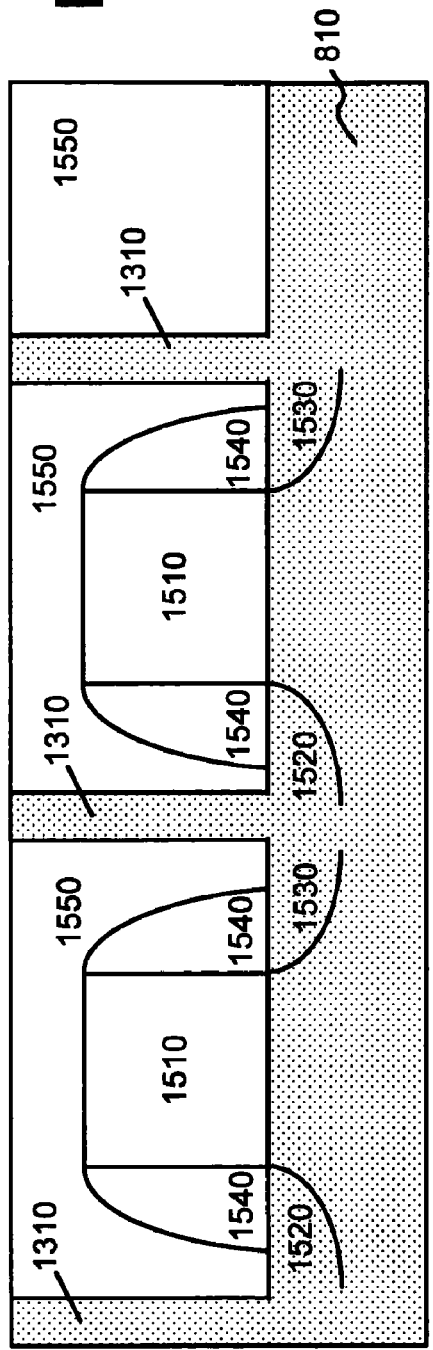
FIGS. 15A and 15B are cross-sections illustrating an exemplary semiconductor device formed in accordance with an embodiment of the invention.

As described above, structures 610 and 1310 may be used in any number of semiconductor devices. FIG. 15A illustrates an exemplary implementation in which conductive structures 1310 may be used. Referring to FIG. 15A, semiconductor device 1500 may include substrate 810 and structures 1310 formed in a manner similar to that described above with respect to FIGS. 8-13. Semiconductor device 1500 may also include a number of memory cell stack structures 1510, spacers 1540 formed adjacent the memory cell stack structures 1510, source regions 1520 and drain regions 1530 associated with each of memory cell stack structures 1510 and an inter-layer dielectric 1550. Inter-layer dielectric 1550 may include a portion of dielectric layer 1110 described above.

Figure 15B:
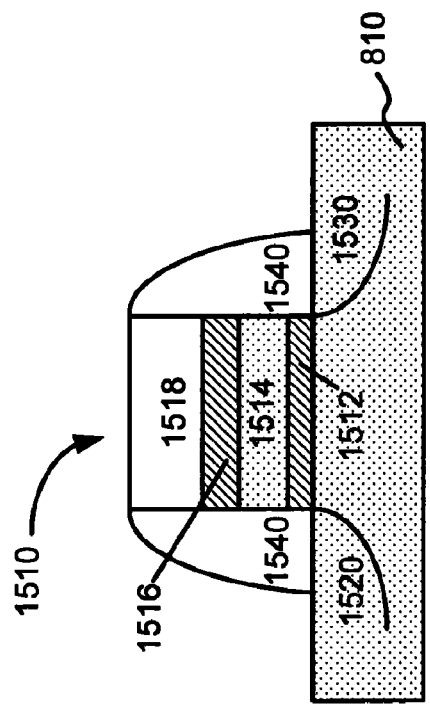

Each memory cell stack structure 1510 may include a relatively thin oxide layer 1512, a charge storage layer 1514, an inter-gate dielectric 1516 and a control gate 1518, as illustrated in FIG. 15B. Oxide layer 1512 may function as a tunnel oxide layer for memory cell stack structure 1510. Charge storage layer 1514 may include a dielectric material, such as a nitride layer, that stores one or more charges for each memory cell. For example, charge storage layer 1514 may store two or more discrete charges for each memory cell in semiconductor device 1500. Alternatively, charge storage layer 1514 may include a conductive material, such as polycrystalline silicon, that acts as a floating gate electrode for semiconductor device 1500. Inter-gate dielectric layer 1516 may include, for example, an oxide, and acts to separate charge storage layer 1514 from control gate 1518. Control gate 1518 may include, for example, polycrystalline silicon, a metal, or another conductive structure. Control gates 1518 for a number of memory cells may be coupled to a word line (not shown) for semiconductor device 1500.

Referring back to FIG. 15A, in this implementation, conductive structures 1310 may function as active bit lines that are coupled to a column of memory cells in semiconductor device 1500. That is, conductive structures 1310 may connect a large number of memory cells in a column and may be used to apply a voltage to the source regions 1520 or drain regions 1530 associated with a column of memory cells. Advantageously, conductive structures 1310 are formed to the desired thickness and are uniform in profile. This helps improve reliability associated with applying voltages to the source region 1520 and drain region 1530.

As described above, in alternative implementations, structures 610 and 1310 may be used in any number of semiconductor devices in which narrow device features may be advantageously employed.

Thus, in accordance with the invention, narrow device features may be formed. Advantageously, the methodology for forming the structures allows multiple structures to be formed with good device profiles, resulting in increased reliability and performance associated with the features. In addition, by forming the features with very narrow widths, increased circuit density may be obtained. The invention may also use non-critical etch processes to form uniform, narrow device features and the processing used to form such features can also be easily integrated into conventional processing used to form semiconductor devices.

In the previous descriptions, numerous specific details are set forth, such as specific materials, structures, chemicals, processes, etc., in order to provide a thorough understanding of the present invention. However, implementations consistent with the invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, various types of chemical vapor deposition (CVD) processes, including low pressure CVD (LPCVD) and enhanced CVD (ECVD) can be employed.

Implementations of the invention are applicable in the manufacturing of semiconductor devices and particularly in devices having small design features and high circuit density. The invention is applicable to the formation of any of various types of semiconductor devices, and hence, details have not been set forth in order to avoid obscuring the thrust of the invention. In addition, in practicing the invention, conventional photolithographic and etching techniques are employed and, hence, the details of such techniques have not been set forth herein in detail.

Further, no element, act or process used in the description of the invention should be construed as critical or essential to the invention unless explicitly described as such. Also, as used herein, the article "a" is intended to include one or more items. Where only one item is intended, the term "one" or similar language is used. In addition, the phrase "based on" is intended to mean "based, at least in part, on" unless explicitly stated otherwise.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:
1. A method of forming a plurality of structures in a semiconductor device, the method comprising:
forming a mask layer over a first layer, the mask layer directly contacting the first layer;
patterning the mask layer to form a mask that includes side surfaces;
forming spacers adjacent the side surfaces of the mask;
etching at least one trench in a portion of the first layer not covered by the mask;

depositing a second material over the semiconductor device, the second material filling the at least one trench;

planarizing the second material, the planarizing removing a portion of the second material, a portion of the mask and portions of the spacers;

removing the mask;

etching the first layer to remove all portions of the first layer not covered by remaining portions of the spacers and the second material, where remaining portions of the first layer comprise the plurality of structures and where the forming spacers adjacent side surfaces of the mask comprises:

forming the spacers to a first width, the first width being approximately equal to a width of the plurality of structures; and forming a memory device between two adjacent structures of the plurality of structures.

2. The method of claim 1, where the width of each of the plurality of structures ranges from about 75 Å to about 400 Å.

3. The method of claim 1, where the planarizing the second material includes:

planarizing the mask and the spacers such that the remaining portions of the spacers and the second material form a T-shaped structure.

4. The method of claim 1, where the planarizing the second material includes:

polishing the second material using the mask as a polish stop, where during the polishing, the remaining portions of the spacers extend laterally from the second material.

5. The method of claim 1, where the etching at least one trench comprises:

etching at least one trench to a depth ranging from about 500 Å to about 2,000 Å.

6. The method of claim 1, where the first layer comprises at least one of silicon or germanium.

7. The method of claim 6, where the spacers comprise an oxide and the second material comprises an oxide.

8. The method of claim 1, where the plurality of structures each have approximately the same width.

9. A method of manufacturing a semiconductor device, the method comprising:

forming a mask layer over a conductive layer;

patterning the mask layer to form a plurality of masks over a conductive layer, where the plurality of masks include sidewalls;

forming spacers adjacent the sidewalls of the plurality of masks;

forming a plurality of trenches in the conductive layer;

depositing a first material to fill at least a portion of each of the plurality of trenches;

polishing the first material using the masks as a polish stopping material, where during the polishing, a portion of each of the spacers is removed and a remaining portion of each of the spacers extends laterally beyond a side surface of one of the respective plurality of trenches;

removing the plurality of masks;

etching the conductive layer to remove all portions of the conductive layer not protected by the spacers or the first material, where remaining portions of the conductive layer form a plurality of conductive structures; and processing the plurality of conductive structures to form at least one of bit lines or word lines in the semiconductor device.

10. The method of claim 9, further comprising:

removing the spacers and the first material.

11. The method of claim 9, where the spacers and the first material comprise a same material.

12. The method of claim 9, where the spacers and the first material comprise silicon oxide.

13. The method of claim 9, where each of the conductive structures comprises silicon and has a width ranging from about 75 Å to about 400 Å.

14. The method of claim 9, where the forming spacers comprises:

forming spacers to a predetermined width, where a width of the conductive structures is based on the predetermined width.

15. A method of manufacturing a semiconductor device, comprising:

forming a mask layer over a conductive layer, the mask layer directly contacting the conductive layer;

patterning the mask layer to form a plurality of masks, the plurality of masks including sidewalls;

forming spacers adjacent the sidewalls of the plurality of masks;

forming a plurality of trenches in the conductive layer;

depositing a first material to fill each of the plurality of trenches;

polishing the first material and the spacers such that an upper surface of the first material is substantially planar with an upper surface of the masks, where remaining portions of the spacers and the first material form T-shaped structures;

removing the plurality of masks;

etching the conductive layer to remove portions of the conductive layer not protected by the spacers or the first material, where remaining portions of the conductive layer form a plurality of conductive structures; and forming a memory cell stack structure between two adjacent structures of the plurality of conductive structures.

16. The method of claim 15, where the plurality of conductive structures comprise bit lines associated with the memory well stack structure.

* * * * *